(12) United States Patent
Daiber et al.

(10) Patent No.: US 6,763,047 B2
(45) Date of Patent: Jul. 13, 2004

(54) EXTERNAL CAVITY LASER APPARATUS AND METHODS

(75) Inventors: Andy Daiber, Palo Alto, CA (US); Mark McDonald, Milpitas, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/173,355

(22) Filed: Jun. 15, 2002

(65) Prior Publication Data

US 2003/0231666 A1 Dec. 18, 2003

(51) Int. Cl.[7] .................................................. H01S 3/04
(52) U.S. Cl. .......................................... 372/34; 372/20
(58) Field of Search ............................. 372/34, 20, 36, 372/29.014, 107

(56) References Cited

U.S. PATENT DOCUMENTS

| | | | | |
|---|---|---|---|---|
| 4,752,109 A | * | 6/1988 | Gordon et al. ................. 385/14 |
| 5,181,214 A | * | 1/1993 | Berger et al. .................. 372/34 |
| 5,265,115 A | * | 11/1993 | Amano .......................... 372/75 |
| 5,267,252 A | * | 11/1993 | Amano .......................... 372/34 |
| 5,329,539 A | * | 7/1994 | Pearson et al. ................ 372/36 |
| 5,446,750 A | * | 8/1995 | Ohtsuka et al. ............... 372/34 |
| 5,463,647 A | * | 10/1995 | Pan ............................... 372/12 |
| 5,717,804 A | * | 2/1998 | Pan et al. ...................... 385/94 |
| 5,862,162 A | * | 1/1999 | Maeda .......................... 372/20 |
| 5,930,430 A | * | 7/1999 | Pan et al. ...................... 385/94 |
| 6,018,535 A | * | 1/2000 | Maeda .......................... 372/20 |
| 6,205,159 B1 | * | 3/2001 | Sesko et al. ................... 372/20 |
| 6,229,828 B1 | * | 5/2001 | Sanders et al. ................ 372/22 |
| 6,288,804 B1 | * | 9/2001 | Daiber et al. ................. 359/15 |
| 6,394,665 B1 | * | 5/2002 | Hayashi ........................ 385/88 |
| 6,526,071 B1 | * | 2/2003 | Zorabedian et al. .......... 372/20 |
| 2002/0012369 A1 | * | 1/2002 | Nasu et al. .................... 372/36 |
| 2002/0136104 A1 | * | 9/2002 | Daiber ...................... 369/44.23 |
| 2002/0172239 A1 | * | 11/2002 | McDonald et al. ........... 372/20 |
| 2003/0007539 A1 | * | 1/2003 | Sell et al. ...................... 372/92 |
| 2003/0007540 A1 | * | 1/2003 | Daiber .......................... 372/92 |
| 2003/0012230 A1 | * | 1/2003 | Hopkins et al. ............... 372/20 |
| 2003/0012239 A1 | * | 1/2003 | Daiber et al. ............. 372/38.01 |
| 2003/0016707 A1 | * | 1/2003 | McDonald et al. ........... 372/20 |

* cited by examiner

Primary Examiner—Paul Ip
Assistant Examiner—Tuan Nguyen
(74) Attorney, Agent, or Firm—Blakely, Sokoloff, Taylor & Zafman LLP

(57) ABSTRACT

Laser apparatus and methods that use active thermal adjustment of an external laser cavity to minimize losses and provide wavelength stability and provide wavelength tuning. The apparatus comprise a thermally conductive platform, a gain medium thermally coupled to the platform, the gain medium having a first facet emitting a first light beam from the first facet, and a reflective element positioned in the first light beam and coupled to the platform, the reflective element and the second facet defining an external laser cavity. The reflective element is mounted on the platform and may be thermally coupled to the platform. Selective thermal control of the external cavity optical path length during laser operation is provided by heating and cooling of the thermally conductive platform.

31 Claims, 8 Drawing Sheets

EXTERNAL CAVITY LASER APPARATUS AND METHODS

BACKGROUND OF THE INVENTION

There is an increasing demand for tunable lasers for test and measurement uses, wavelength characterization of optical components, fiberoptic networks and other applications. In dense wavelength division multiplexing (DWDM) fiberoptic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overcome the limitations of individual DFB devices. Various laser tuning mechanisms have been developed to provide external cavity wavelength selection, such as mechanically tuned gratings used in transmission and reflection. External cavity lasers must be able to provide a stable, single mode output at selectable wavelengths while effectively suppress lasing associated with external cavity modes that are within the gain bandwidth of the cavity. These goals have been difficult to achieve, and there is accordingly a need for an external cavity laser that provides stable, single mode operation at selectable wavelengths. The present invention satisfies this need, as well as others, and overcomes deficiencies found in the background art.

DETAILED DESCRIPTION OF THE INVENTION

Figure 1:
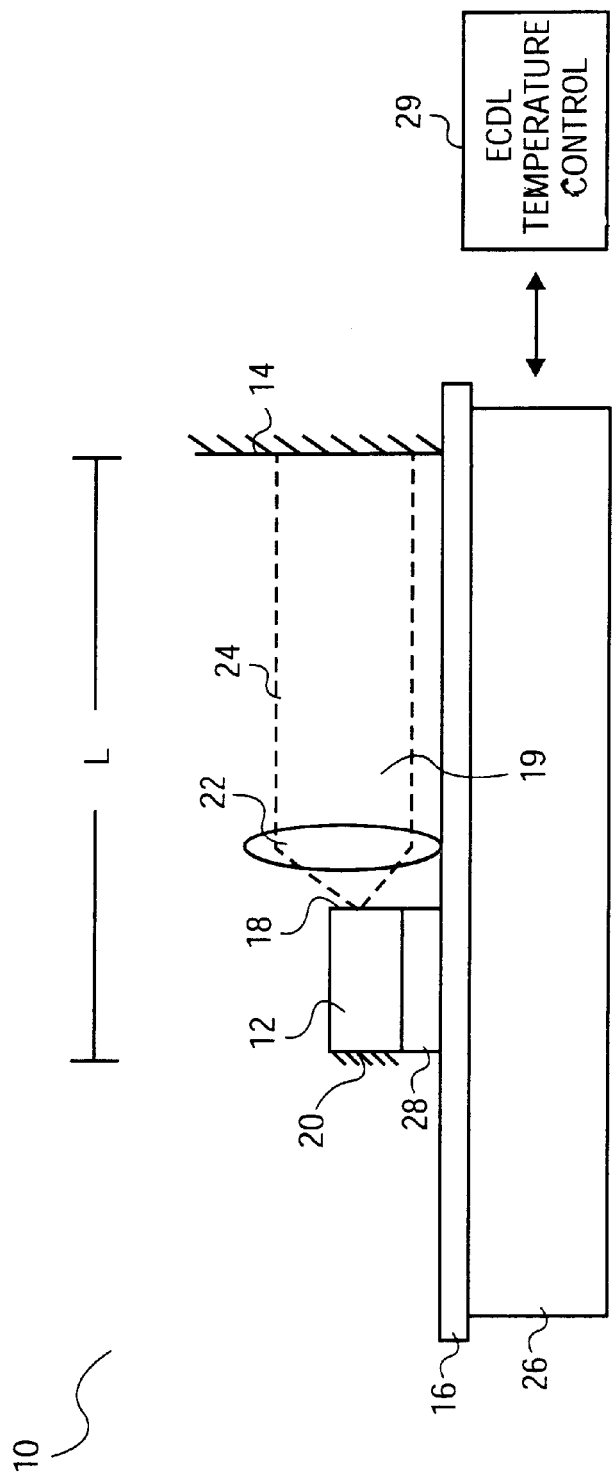
FIG. 1 is a schematic side elevation view of a laser apparatus in accordance with the invention.

The invention provides laser apparatus and methods that use active thermal adjustment of an external laser cavity to minimize losses, and provide wavelength stability and provide wavelength tuning. The apparatus of the invention, in general term, comprise a thermally conductive platform, a gain medium thermally coupled to the platform, the gain medium having a first facet emitting a first light beam from the first facet, a reflective element positioned in the first light beam and coupled to the platform, the reflective element and the second facet defining an external laser cavity. The reflective element is mounted on the platform and may be thermally coupled to the platform. The apparatus further comprises a thermal control element thermally coupled to the platform and configured to provide temperature control to the platform. The invention provides selective thermal control of the external cavity optical path length during laser operation.

The platform may comprise a thermally conductive material to provide good thermal transfer to, and rapid temperature change of, the gain medium and other components in the ECDL that are thermally coupled to the platform.

The laser apparatus of the invention may further comprise a wavelength selection element coupled to the platform, and positioned in the first light beam before the reflective element. The wavelength selection element may comprise one or more etalons, gratings, prisms, filters or like devices, or various combinations thereof and may be tunable mechanically, electrically, thermally, or by other mechanism to provide wavelength selective feedback to the gain medium.

The laser apparatus may further comprise an external cavity optical path length control element positioned in the light beam before the end reflector that is thermally coupled to the platform. The external cavity optical path length control element may be made of materials which allow the refractive index of the external cavity optical path length control element to be temperature controlled, allowing thermal control of the refractive index of the external cavity optical path length control element by temperature change of the platform. In certain embodiments, the external cavity optical path length control element may be modulated or dithered to introduce a frequency modulation in the external cavity optical path length, which is usable in control and servo systems for error signal generation.

In some embodiments, the laser apparatus may comprise a detector positioned to monitor optical output power of the apparatus, and a servo or control element operatively coupled to the optical path length control element and detector that is configured to generate error signals according to the modulation of the external cavity optical path length, and to adjust the thermal control element, and hence the temperature of the platform and the optical path length control element, according to the error signals.

In many embodiments, the laser apparatus may comprise an output assembly for coupling a second or output beam emitted from a second facet of the gain medium into an optical fiber. Some or all of the components of the output assembly may be coupled, to the platform and thermally controlled thereby. The laser apparatus may comprise an optical isolator positioned in the output beam of the gain medium and thermally coupled to the platform to thermally control the optimum wavelength for feedback suppression by the optical isolator.

The invention also provides methods of laser operation, comprising providing a thermally conductive platform, thermally coupling a gain medium to the platform, emitting a light beam by the gain medium, positioning a reflective element in the light beam; coupling the reflective element to the platform, defining an external laser cavity with that the reflective element and a facet of the gain medium, and thermally controlling the platform. The methods may further comprise thermally controlling the gain medium by the thermal controlling of the platform. The methods of the invention may additionally comprise controlling optical path length of the external laser cavity by the thermal controlling of the platform. The thermal controlling of the optical path length of the external laser cavity comprises thermally controlling distance between the reflective element and the facet of the gain medium. The thermal controlling of external cavity optical path length may additionally, or alternatively, comprise thermally controlling refractive index of the gain medium.

In certain embodiments, the methods may also comprise positioning an optical path length control element in the light beam, and thermally coupling the optical path length control element to the platform. The thermal controlling of the optical path length of the external laser cavity may further comprise thermally controlling refractive index of the optical path length control element. The methods may additionally comprise introducing a frequency modulation to the external cavity optical path length. The introducing a frequency modulation may occur via dithering the optical path length control element. In still other embodiments, the methods may comprise generating error signals from the frequency modulation introduced to the external cavity optical path length, and wherein the thermal controlling of the optical path length of the external laser cavity is carried out according to the error signals.

The methods may, in some embodiments, also comprise positioning a wavelength selection element in the light beam, and feeding back light of a selected wavelength to the gain medium.

These and other objects, advantages, and features of the invention will become apparent to those persons skilled in the art upon reading the details of the thermally controlled optical isolator as more fully described below.

Referring more specifically to the drawings, for illustrative purposes the present invention is embodied in the apparatus and method shown in FIG. 1 through FIG. 8. It will be appreciated that the apparatus may vary as to configuration and as to details of the parts, and that the method may vary as to details and the order of events, without departing from the basic concepts as disclosed herein. The invention is disclosed primarily in terms of use with an external cavity laser. However, it will be readily apparent to those skilled in the art that the invention may be used with other types of lasers and optical systems. The relative sizes of components and distances therebetween as shown in the drawings are in many instances exaggerated for reason of clarity, and should not be considered limiting. Any definitions herein are provided for reason of clarity, and should not be considered as limiting, and any technical and scientific terms used herein are intended to have the same meaning as commonly understood by those skilled in the art. It should also be understood that the terminology used herein is for the purpose of describing particular embodiments only, and is not intended to be limiting, since the scope of the present invention will be limited only by the appended claims.

Referring now to FIG. 1, there is shown a laser apparatus 10 that employs thermal control of external cavity optical path length in accordance with the invention. The apparatus 10 includes a gain medium 12 and a reflective element 14 coupled to a thermally conductive base, substrate or platform 16. Gain medium 12 may comprise, for example, a conventional Fabry-Perot diode emitter chip and has an anti-reflection (AR) coated facet 18 and a partially reflective facet 20. Reflective element 14 may comprise a mirror, grating, prism or other reflector or retroreflector. The external laser cavity is delineated by facet 20 and reflective element 14, and has a length l. Gain medium 12 emits a light beam 19 from facet 18 that is collimated by lens 22 to define an optical path 24. Beam 19 is reflected from end reflector 14 and returned along path 24 and is returned to gain medium by lens 22. Wavelength selection components as described below are positioned in path 24 to feed back light to gain medium 12 at a selected wavelength. End mirror 14 may be curved in certain embodiments such that lens 22 may be omitted. A toric lens system or other optical element (s) capable of re-imaging the returning beam 19 onto facet 18, so that gain medium 12 receives feedback from the external cavity, may be used in place of lens 22.

Platform 16 is coupled to a thermal control device such as a thermoelectric controller (TEC) 26, which controls the temperature of platform 16 via thermal conduction. Temperature control of platform 16 in this manner allows temperature control of the laser components mounted on platform, and provides for adjustment of the external cavity optical path length l of the laser apparatus 10 as described below.

The thermally conductive platform 16 may be made from any thermally conductive material. Various metals, metal nitrides, carbides and oxides, or alloys, blends, mixtures or composites thereof, can provide materials with good thermal conductivity and relatively low coefficient of thermal expansion (CTE). Aluminum nitride (AlN) may be used as the platform material in certain embodiments. The material of platform 16 may be selected to have a particular CTE that allows CTE matching to components mounted on platform 16. In some embodiments, platform 16 may comprise a high CTE material, such as aluminum, copper, zinc or other metal or metal alloy, so that a desired amount of physical expansion and contraction according to temperature control by thermoelectric controller 26 may occur. The platform 16 may in certain embodiments be made of silicon, allowing CTE matching to silicon components such as thermally tuned etalons (not shown in FIG. 1) as described below. The use of silicon for platform 16 also allows for the integration of conductor paths directly onto the platform 16, and formation of specific geometries on platform 16 using conventional silicon machining and fabrication techniques. Various other materials of suitable CTE will suggest themselves to those skilled in the art upon review of this disclosure.

The gain medium 12 is thermally coupled to platform 16 such that thermoelectric controller 26 can control the temperature of gain medium 12 by thermal conduction through platform 16. "Thermally coupling" as used herein means any mounting or coupling arrangement or configuration that provides effective heat flow for thermal control of thermally coupled components. Gain medium 12 is mounted on a thermally conductive carrier 28, which in turn is coupled to platform 16. Gain medium 12 thus is thermally coupled to platform 16 through carrier 28. Carrier 28, like platform 16, comprises a thermally conductive material such as a metal, metal oxide, metal nitride, metal carbide, or alloys, blends, mixtures or composites thereof. In certain embodiments the carrier 28 may comprises aluminum nitride, silicon carbide, or a silicon carbide blend (alloy). In other embodiments, carrier 28 may comprise a copper tungsten (CuW) alloy. The substrate 16 and carrier 28 may be matched in CTE to each other and to gain medium 12. Thermally conductive adhesives or solders may be used to mount gain medium 12 onto carrier 28, and to mount carrier 28 onto platform 16.

Reflective element 14 is also mounted on platform 16 as noted above and may, in certain embodiments, be thermally coupled to platform 16 using thermally conductive adhesives, solders and/or carriers or supports. In many embodiments reflector 14 need not be subject to temperature control during laser operation, and reflector may be mounted on platform 16 without consideration for thermal coupling thereto. Various other optical components usable in external cavity lasers, such as a wavelength selection element (not shown in FIG. 1) may also be positioned within the external cavity defined by facet 20 and reflective element 14 and mounted on platform 16, as described below. Output coupling optics (also not shown) may be associated with facet 20 of gain medium for coupling the output of the external cavity laser apparatus 10 into an optical fiber, and may also be thermally coupled to platform 16.

Tuning of external cavity optical path length of the laser apparatus 10 during laser operation is used to provide fine tuning of a selected wavelength via optimizing the relationship of the laser external cavity modes with the selected wavelength. The optical path length of an optical element or component generally is equal to the product of its refractive index and its dimension along the optical path through the element or component. The optical path length of an external cavity laser is a sum of the products of indices of refraction and optical thicknesses of the various elements or components present in the optical path across the external cavity, including air present within the cavity. The optical path length of an external cavity laser thus can be shown as $$L_{Opt} = \Sigma n_i l_i \quad (1)$$

wherein $n_i$ is the index of refraction of each element and $l_i$ is the thickness of the element along the optical path. The integer number of half-wavelengths supported by an element with fixed end points increases as the refractive index of the element increases, in accordance with Huygens principle. This results from the observation that light travels more slowly in media of higher refractive index, and the wave peaks are correspondingly more closely packed. Thus, over an identical distance, an element with a higher index of refraction supports a greater number of wave peaks, and the optical path length, rather than the physical path length, is a more accurate measure of the integral number of half wavelengths that may be supported by an external cavity.

From equation (1), it can be seen that external cavity optical path length of the apparatus 10 may be adjusted by physical adjustment of the spacing between facet 26 and end reflector 48 to change the physical length 1, and/or by adjusting the refractive index of material present in the external cavity. Semiconductor gain media materials such as InGaAs and InGaAsP have generally high refractive indices and thus provide an important component of the overall external cavity optical path length. These gain media materials also exhibit relatively large changes in refractive index with respect to temperature. Gain medium refractive index adjustment can be effectively carried out by temperature control of gain medium 12, by heating and cooling thereof by thermoelectric controller 26 through platform 16 and carrier 28, to adjust the external cavity optical path length.

Heating and cooling of thermally conductive platform 16 can also give rise to expansion and contraction of platform 16 to change the physical length 1 separating facet 26 and end reflector 48. The CTE of platform 16, however, will in many embodiments be selected to conform in CTE to the various components mounted on platform 16 as described below. The change in the refractive index of gain medium 12 will thus be the dominant factor in the thermal adjustment of the external cavity optical path length in such embodiments.

A control element 29 is operatively coupled to thermoelectric controller 26 to provide control instructions thereto regarding heating or cooling of platform 16, and hence gain medium 12, to control external cavity optical path length. Control element 19 may comprise a conventional data processor, and provides tuning signals to thermoelectric controller 26 for selective temperature adjustment of platform 16 and components thermally coupled to platform 16. Control element 29 may be operatively coupled to a detector (not shown) than monitors power associated with the output of the apparatus 10, so that control element 29 may generate error signals from the detector output to optimize the thermal tuning of the external cavity optical path length during operation of the apparatus. The serving of external cavity optical path length according to errors signals determined from laser output power is discussed further below.

Figure 2:
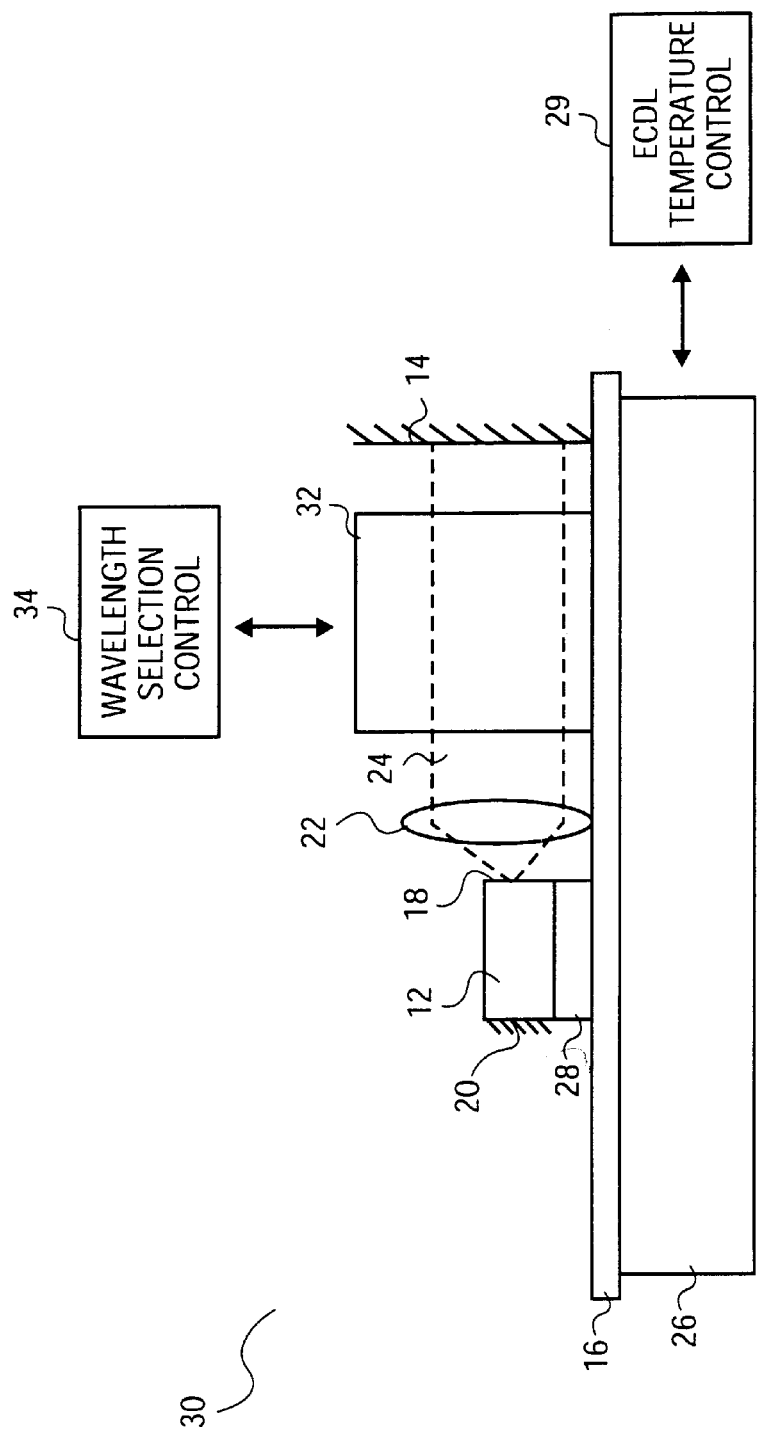
FIG. 2 is a schematic side elevation view of another embodiment of a laser apparatus in accordance with the invention.

Referring now to FIG. 2, another embodiment of an external cavity laser apparatus 30 in accordance with the invention is shown, wherein like reference numbers are used to denote like parts. Apparatus 30 includes a gain medium 12, an end reflective element 14, collimating lens 22, and a wavelength selection element 32 which may be mounted on thermally conductive platform 16 or unsupported by platform 16. The thermally conductive platform 16 and components thermally coupled thereto are thermally controlled by thermoelectric controller (TEC) 26 as described above. The gain medium 12 is thermally controlled by platform 16 via the gain medium mount 28, which has matched CTE to platform 16 and the gain medium 12.

In the embodiment shown in FIG. 2, wavelength selection element 32 is shown positioned in optical path 19 between gain medium 12 and end reflector 14. Wavelength selection element 32, may comprise one or more etalons, gratings, prisms or other element or elements that are capable of providing feedback to gain medium 24 along path 34 at a selected wavelength. In the embodiment of FIG. 2, wavelength selection element 32 is shown as a single etalon that operates as a Fabry-Perot interference filter. Wavelength selection element 32 is configured to have a free spectral range such that the interference between faces 33a, 33b results in a single transmission peak within a wavelength range of interest such as, for example, the gain bandwidth of gain medium 24, the wavelength range of the ITU (International Telecommunications Union) "C" band (approximately 192.1 THz to approximately 196.1 THz or approximately 1525 to approximately 1565 nanometers), or other wavelength range. The wavelength maximum of the single transmission peak is tunable by adjustment of wavelength selection element 32 by one or more of the tuning mechanisms discussed below. A grid etalon (not shown) may also be included in path 19, with the grid etalon configured to generate a plurality of transmission peaks corresponding to selectable wavelengths such as the ITU channel wavelengths.

The single transmission peak provided by wavelength selection element 32 allows feedback of light at the transmission peak wavelength to gain medium 12 along path 19, while suppressing potential feedback at other wavelengths which may arise due to modes associated with the external cavity defined by gain medium facet 20 and end reflector 14, transmission maxima associated with a grid generator etalon (not shown) that may be present within the external cavity, or other possible undesired feedback that is not at the selected wavelength. The finesse of wavelength selection element 32 may be configured as needed to provide for effective suppression of feedback within the external cavity at wavelengths other than the single transmission peak defined by wavelength selection element 32. One or more additional filter elements (not shown) may also be used in the external cavity to suppress feedback to gain medium 12 at unselected wavelengths.

A wavelength selection controller, or control element 34 is operatively coupled to wavelength selection element 32, and provides for adjustment or selection of the wavelength of the transmission peak defined by wavelength selection element 32, and, hence the wavelength of light that is fed back to gain medium 42. Control element 34 may comprise a conventional data processor for generating tuning signals, as well a physical mechanism or system for implementing the tuning. Wavelength selection element 32 may be tunable by various mechanisms, including thermo-optic, electro-optic, acousto-optic, and piezo-optic tuning, mechanical angle tuning, strain-based tuning, or other tuning mechanism or combination of tuning mechanisms, in order adjust the wavelength of the light that is returned to gain medium 12 along path 19. The use of mechanically tuned tapered interference filters and wedge-shaped etalons, transmissive and reflective gratings, and electro-optically tuned etalons for wavelength selection is described, for example, in U.S. patent application Ser. No. 09/814,464. The use of reflective gratings for wavelength selection is also described in U.S. patent application Ser. No. 10/099,730. The use of thermo-optically tuned etalons and etalons of birefringent material is related in U.S. patent application Ser. No. 10/099,649. The aforementioned disclosures are incorporated herein by reference. In embodiments where a reflective grating is used, end reflector 14 may be positioned in a Litmann-Metcalf arrangement to return a selected diffraction back to the gain medium 12, or, in a Littrow arrangement, end reflector 14 may be omitted, as the grating is positioned to return a selected diffraction directly to the gain medium 12. Other types of wavelength selection elements and tuning mechanisms therefore may suggest themselves to those skilled in the art, and are also considered to be within the scope of this disclosure.

In operation of the laser apparatus 30, current is applied to gain medium 12 in a conventional manner. The beam 24 emitted from facet 18 of gain medium 12 travels path 19 and passes through or otherwise interacts with wavelength selection element 32. Wavelength selection element 32 is tuned or adjusted to provide transmission along path 19 at a selected wavelength, and light at the selected wavelength is returned along path 19 to gain medium 1 from wavelength selection element 32 to support lasing in the external cavity at the selected wavelength. Feedback to gain medium 12 at other wavelengths is suppressed by wavelength selection element 32 to prevent multi-mode lasing.

During operation of the apparatus 30 in the above manner, the external, cavity-optical path length is thermally adjusted to optimize the relationship between laser external cavity modes and the selected wavelength defined by wavelength selection element 32. Thermal control of the external cavity optical path length is achieved in accordance with the invention by heating or cooling platform 16 by thermoelectric controller 26 to provide temperature control of gain medium refractive index via thermal conduction with gain medium 12, and/or via thermal expansion and contraction of platform 16 to control the spacing or distance between facet 20 and reflective element 14.

Figure 3:
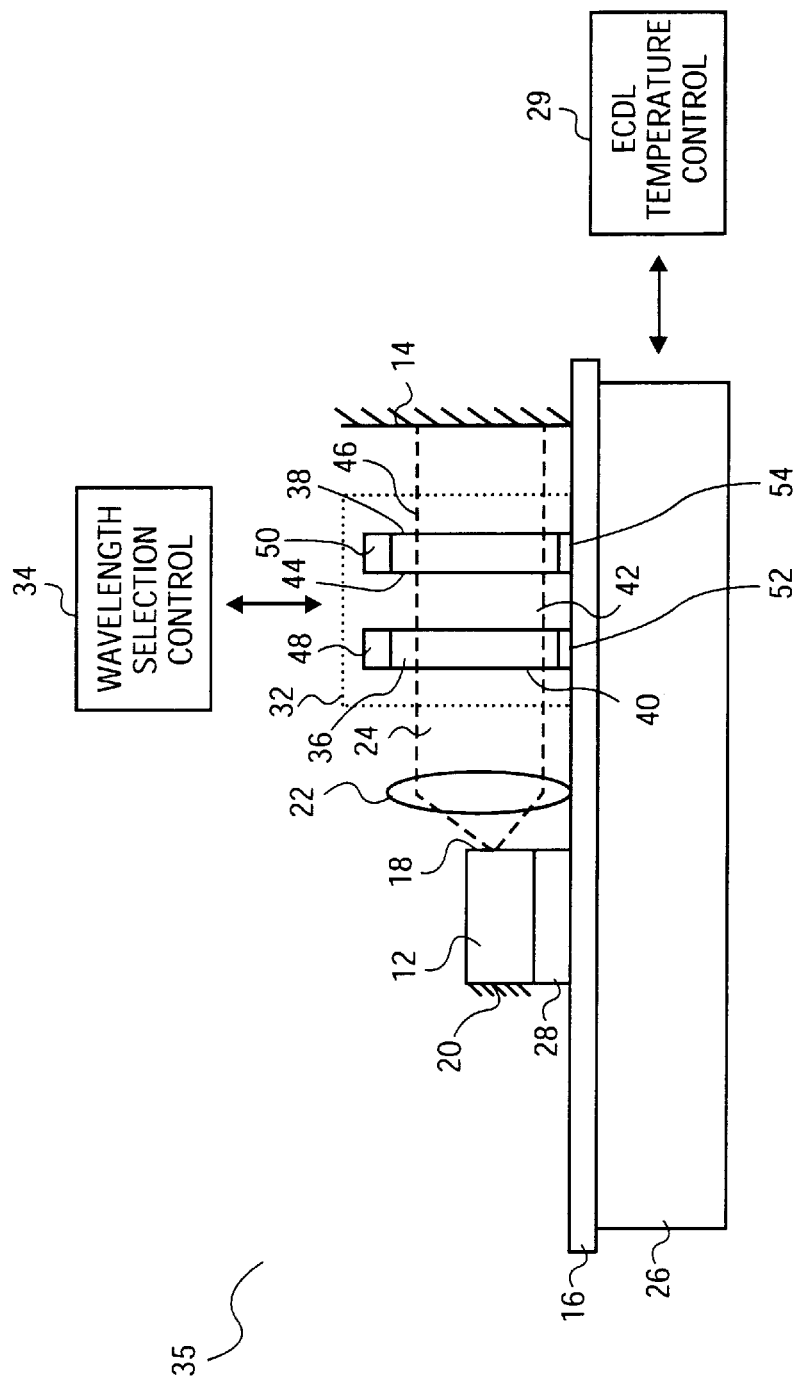
FIG. 3 is a schematic side elevation view of another embodiment of a laser apparatus in accordance with the invention.

Referring now to FIG. 3, an external cavity laser apparatus 35 in accordance with the invention is shown, wherein like reference numbers are used to denote like parts. The laser apparatus 35 has a wavelength selection element 32 that comprises first and second tunable etalons 36 and 38. The first and second tunable etalons 36, 38 are positioned within the external cavity defined by end mirror 14 and facet 20. Tunable elements 36, 38 are operable together to preferentially feed back light of a selected wavelength to gain medium 12 during operation of the laser apparatus 35. Etalons 36, 38 are shown in the form of first and second tunable Fabry-Perot etalons, which may comprise parallel plate solid, liquid or gas spaced etalons, and which may be tuned by precise dimensioning of the optical thickness or path length. In other embodiments, etalon 36 and/or etalon 38 may be replaced with a grating, prism, thin film interference filter, or other tunable element.

First etalon 36 includes faces 40, 42, and has a first free spectral range $FSR_1$ according to the spacing between faces 40, 42 and the refractive index of the material of etalon 36. Second etalon 38 includes faces 44, 46, and has a second free spectral range $FSR_2$ defined by to spacing between faces 44, 46 and the refractive index of the material of etalon 38. Etalons 36, 38 may comprise the same material or different materials with different refractive indices. Etalons 36, 38 each are tunable by adjustment of their optical thickness, to provide for adjustment or tuning of $FSR_1$ and $FSR_2$, which in turn provides selective wavelength tuning for the laser apparatus 35 as described further below. Tuning of etalons 36, 38 can involve adjustment of the distance between faces 40, 42 and 44; 46 of etalons 36, 38 and/or adjustment of the refractive index of the etalon material. Various tuning mechanisms involving using various techniques may be used, including thermo-optic, electro-optic, acousto-optic, piezo-optic, mechanical, or other tuning to vary refractive index of etalon material and/or vary the spacing of etalon faces. More than one such tuning effect may be applied simultaneously to one or both etalons 36, 38, depending upon the particular embodiment of the invention.

In the embodiment shown in FIG. 3, first and second etalons 36, 38 each are tunable by thermo-optic effect. The term "thermo-optic" tuning means tuning by temperature-induced change in etalon material refractive index, temperature induced change in the physical thickness of an etalon, or both. The etalon materials used in certain embodiments have temperature dependent refractive indices as well as coefficients of thermal expansion such that thermo-optic tuning involves simultaneous thermal control of etalon material refractive index as well as thermal control of etalon physical thickness by selective heating or cooling. Semiconductor materials such as silicon and gallium arsenide provide a large change in refractive index with temperature and may be used for the material etalons 36, 38 for effective thermo-optic tuning. In many embodiments, etalons 36, 38 may comprise silicon, which is transparent over the gain bandwidth or output wavelength range of InGaAs, InGaAsP and other gain media.

To provide thermo-optic tuning of etalons 36, 38, thermal control element 48 is operatively coupled to etalon 36, and a thermal control element 50 is operatively coupled to etalon 38, to provide heating and cooling independently to etalons 36, 38 via thermal conduction. Thermal control elements 48, 50 in turn are operatively coupled to a wavelength selection controller 34. Controller 34 may comprise a conventional data processor, and provides tuning signals to thermal control elements 48, 50 for thermal adjustment or tuning of etalons 36, 38 according to selectable wavelength information stored in a look-up table or other wavelength selection criteria. Thermal control elements 48, 50 include temperature monitoring elements (not shown) that are operatively coupled to controller 34, and which can monitor etalon temperature during laser operation and communicate etalon temperature information to controller 34. Each thermal control element 48, 50 includes a heating element (not shown) that allows adjustment of etalon temperature according to instructions from controller. In embodiments wherein silicon is used for the etalon material, the heating and temperature monitoring aspects of thermal control elements 48, 50 may be integral to the etalons 36, 38 and formed thereon using conventional silicon machining or fabrication techniques.

Thermal control elements 48, 50 allow each etalon 36, 38 to be subject to independent thermal control. Thermal control elements 48, 50 can be used to provide common or parallel heating (both etalons heated or cooled at substantially the same rate of temperature change) as well as differential heating (etalons are heated or cooled at a substantially different rate of temperature change) for wavelength tuning as described below. Thermal control elements 48, 50 may be integrated onto a face or faces each etalon 36, 38 as also described below. Mounting elements 52 and 54 may be used to couple etalons 36, 38 to platform 16, such that platform 16 may be used as a heat sink by etalons 36, 38. In other embodiments, mounting elements 52, 54 may be thermally insulating and configured to isolate etalons 36, 38 from the thermally controlled platform 16.

Etalons 36, 38 provide selective wavelength tuning for the apparatus 35 via a Vernier effect. With Vernier tuning, etalons 36 38 each define a plurality of transmission peaks which operate together to create a single transmission peak within a wavelength range according to the joint effect of etalons 36, 38. The location of this single, joint transmission peak is adjustable by thermo-optic tuning of one or both etalons 36, 38. The use of Vernier tuning with two or more tunable etalons in the apparatus 35 has the advantage of allowing thermo-optic tuning for wavelength selection over a smaller operating temperature range than is possible using a single tunable etalon. This lower overall operating temperature reduces undesirable convective effects, reduces power consumption, and avoids temperature dispersion effects that arise in many etalon materials when the materials are heated or cooled over larger temperature ranges. Such dispersion may arise from varying material thermo-optic coefficients, stress or strain induced by variation of material coefficient of thermal expansion, and liberation of thermally excited free carriers at elevated temperatures. Thermo-optic tuning of a single semiconductor etalon element, for example, can provide wavelength tuning over only a limited wavelength range due to the large temperature range required, as the high temperatures needed for tuning results in excessive losses due to thermally excited free carriers in the etalon. The use of Vernier effect tuning for wavelength selection using thermo-optic tuning two or more etalons is also described in U.S. patent application Ser. No. 10/099, 649, the disclosure of which is incorporated herein by reference.

During operation of the apparatus 35 wherein feedback to gain medium 12 at the selected wavelength is provided by the operation of etalons 36, 38, the external cavity optical path length is thermally adjusted by heating or cooling gain medium 12 via thermoelectric controller 26 to provide temperature control of gain medium refractive index, and/or via thermal expansion and contraction of platform 16 to control the spacing or distance between facet 20 and reflective element 14 as described above. In many embodiments, thermal tuning of etalons 36, 28 is carried out at substantially higher temperatures than the thermal control of external cavity optical path length via heating and cooling platform 16. Further, platform 16 in many embodiments will have a substantially greater mass than etalons 36, 38. Thus, in certain embodiments, thermally tuned etalons 36, 38 may be thermally coupled to platform 16, with platform being usable as a heat sink to facilitate cooling of etalons 36, 38 as required for tuning.

Figure 4:
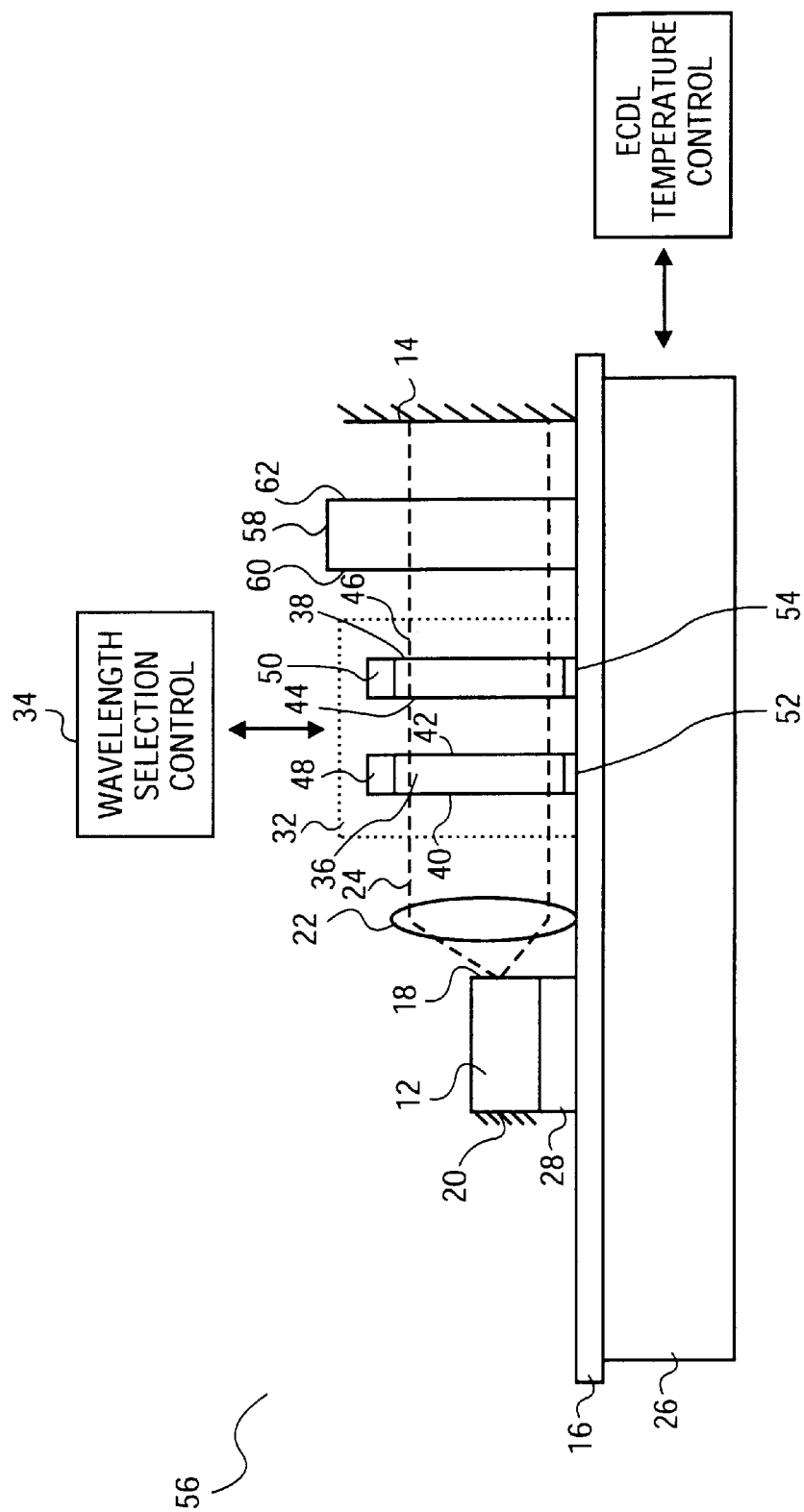
FIG. 4 is a schematic side elevation view of another embodiment of a laser apparatus in accordance with the invention.

Referring now to FIG. 4, an external cavity laser apparatus 56 in accordance with the invention is shown, wherein like reference numbers are used to denote like parts. The laser apparatus 56 comprises a thermally conductive platform 16 and TEC 26, with a gain medium 12, end reflector 14, wavelength selection element 32 and an external cavity optical path length control element 58 each mounted on platform 16. Gain medium 12 is thermally coupled to platform 16 via carrier 28, and etalons 36, 38 may be thermally coupled to platform 16 as well in order to use platform 16 as a heat sink. The optical path length control element 58 is positioned in optical path 24 between gain medium 12 and end reflector 14, and is thermally coupled to platform 16 to provide thermal control to the optical path length control element 58 from TEC 26 via thermal conduction through platform 16. The faces 60, 62 may be anti-reflection coated so that optical path length control element 58 does not act as an interference filter. Alternatively, surfaces 60, 62 of optical path length control element 58, so that optical path length control element 58 operates as an interference filter as part of wavelength selection element 32.

The optical path length control element 58, in the embodiment of FIG. 4, is made of a thermo-optic material that allows the adjustment of the refractive index of optical path length control element 58. The optical path length control element 58 will in many embodiments comprise a high refractive index material that is temperature dependent, i.e., a refractive index that can be varied according to selective heating or cooling. The same materials used for thermo-optically tuned etalons 36, 38 discussed above may be used for optical path length control element 58, and silicon, as noted above, has a relatively high refractive index that can be effectively varied via temperature control.

In operation of the apparatus 56, etalons 36, 38 feedback light to gain medium 12 at a selected wavelength while suppressing lasing at unwanted wavelengths as described above. During laser operation in this manner, external cavity optical path length adjustment is carried out via thermal control of platform 16 by TEC 26, which accordingly provides thermal control of gain medium 12 and optical path length control element 58, which are thermally coupled to platform 16. In the apparatus 56, the combined effect of thermal refractive index adjustment of gain medium 12 and thermal refractive index adjustment of optical path length control element 58, by heating or cooling gain medium 12 and optical path length control element 58 via platform, operates to selectively adjust or control the external cavity optical path length. Since a larger portion of the laser external cavity in the apparatus 56 is occupied by material with a thermally controllable refractive index (i.e., both gain medium and optical path length control element 58), a greater level of optical path length control for the apparatus 56 is provided, and a smaller temperature range for heating and cooling of platform 16 by TEC 26 may be used to provide the same amount of optical path length adjustment for the external cavity.

In some embodiments, additional optical path length control elements may be included in the apparatus 56 and thermally coupled to platform 16, to provide an even greater level of optical path length control for the apparatus 56. It should be noted that etalons 36, 38 during tuning thereof will also effect external cavity optical path length and should be taken into account in the adjustment of the laser external cavity. In other embodiments, optical path length control element 58 may comprise an electro optic material such as lithium niobate that has a voltage dependent refractive index. In such embodiments, optical path length control element 58 may be mounted on platform 16 but not necessarily thermally coupled to platform 16, and refractive index control of optical path length control element 58 would be carried out by separate voltage control. The use of an electro-optic optical path length control element for external cavity optical path length control is also described in U.S. patent application Ser. No. 09/900,426, the disclosure of which is incorporated herein by reference.

Figure 5:
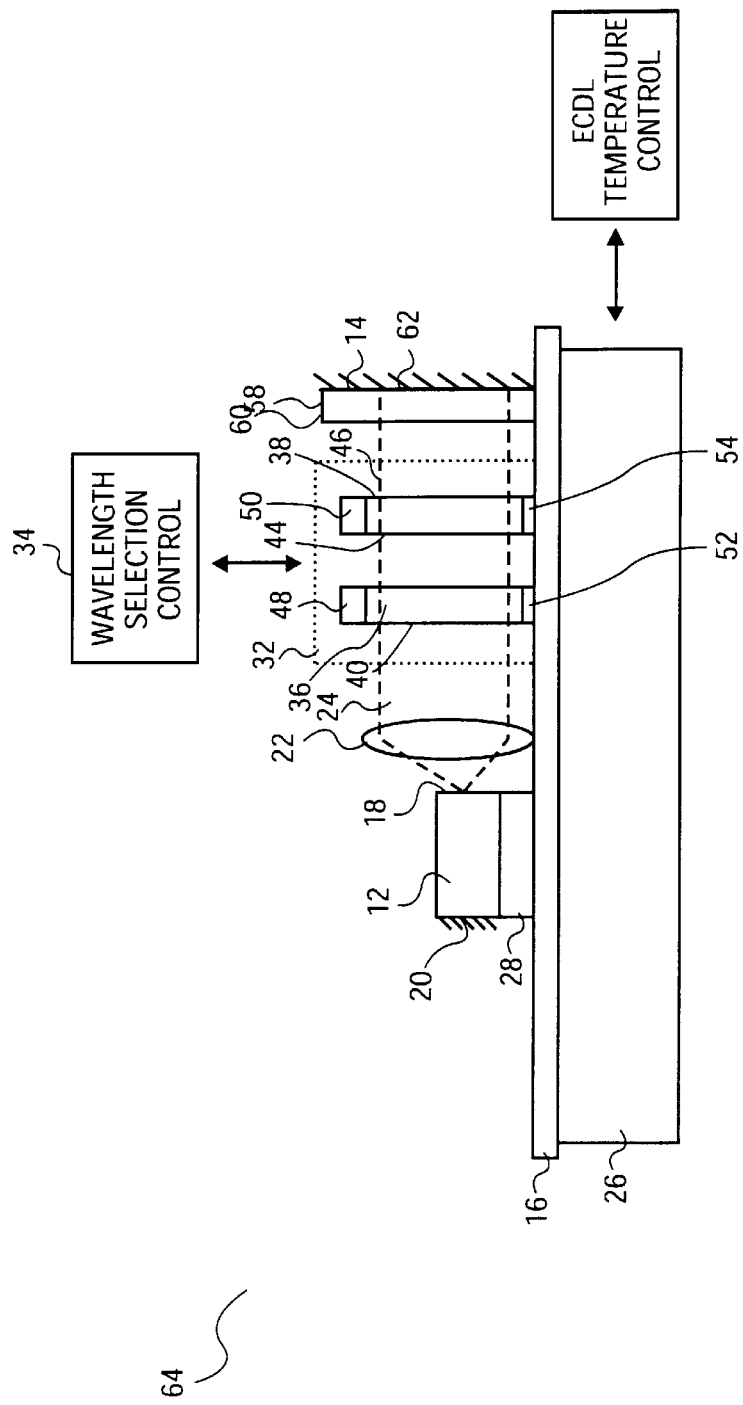
FIG. 5 is a schematic side elevation view of another embodiment of a laser apparatus in accordance with the invention.

Referring now to FIG. 5, an external cavity laser apparatus 64 in accordance with the invention is shown, wherein like reference numbers are used to denote like parts. In the apparatus 64 the external cavity optical path length control element 58 includes a reflective coating or mirror on surface 62, such that surface 62 serves as the end reflector 14 of the laser external cavity. The optical path length control element 58 is thermally coupled to platform 16 and otherwise operates in the manner described above for the apparatus 54 of FIG. 4.

Figure 6:
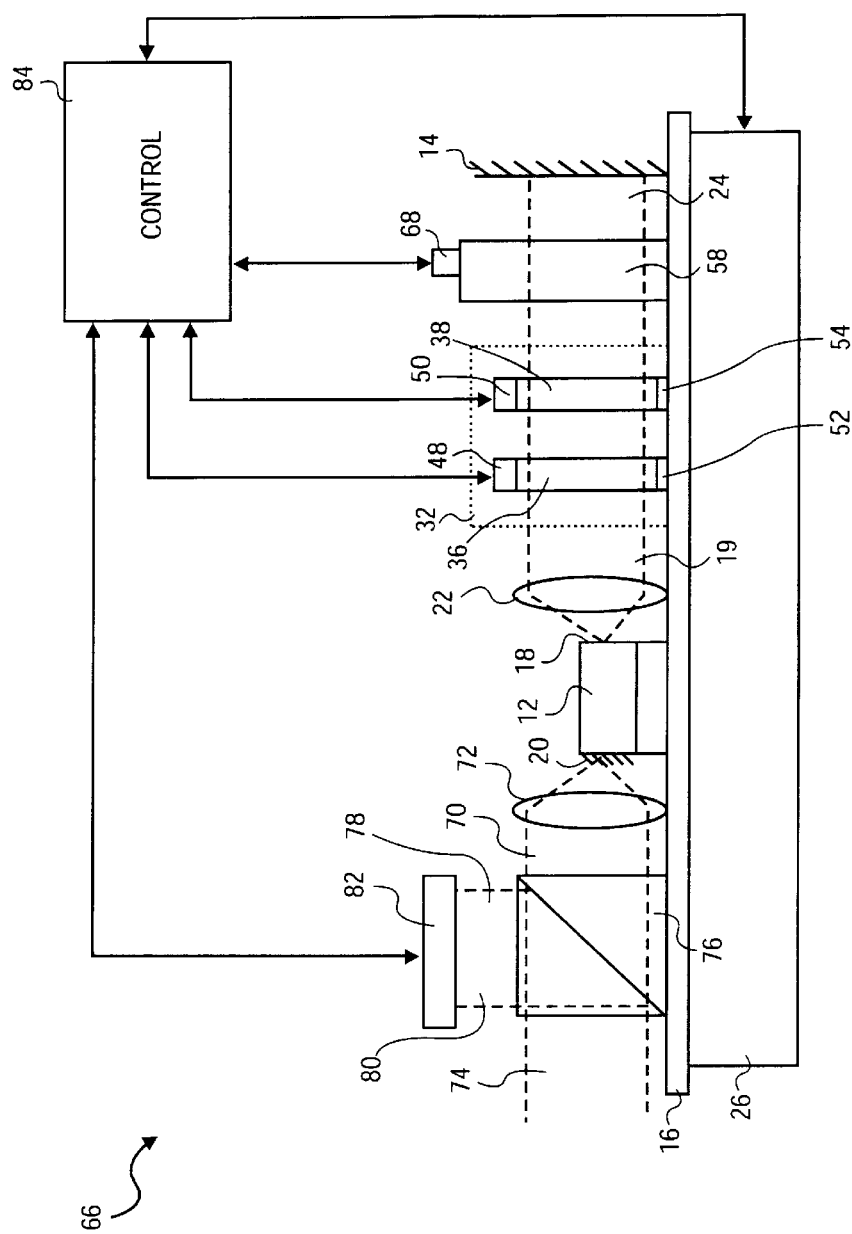
FIG. 6 is a schematic side elevation view of another embodiment of a laser apparatus in accordance with the invention.

Referring to FIG. 6, an external cavity laser apparatus 66 in accordance with the invention is shown, wherein like reference numbers are used to denote like parts. The laser apparatus 66 includes an external cavity optical path length element 58 with which a dither element 68 coupled thereto. Dither element 68 is configured to introduce a frequency modulation into the laser external cavity. The presence of a known frequency modulation in the laser external cavity provides a good mechanism for developing error signals indicative of external cavity losses that are usable to correct or adjust the external cavity optical path length during laser operation. Dither element 68 is capable of generating a frequency modulation according to mechanical, thermal, electrical or other type of modulation of element 68 by modulating the refractive index of the material of element 58 and/or the physical thickness of element 58 with respect to path 24. Where optical path length control element 58 comprises a thermo-optic material, dither element 68 may comprise a thermal controller that introduces a periodic temperature modulation to element 58. Where element 58 comprises a piezoelectric material, dither element may comprise a mechanical or acoustic device that introduces a vibration to element. In still other embodiments, element may comprise an electro-optic material subject to voltage modulation by dither element. The modulation introduced by dither element 68 may comprise, for example, a frequency modulation of between about 5 Hz and about 20 KHz, depending upon the type of material of element 58 and the modulation effect used. The modulation of element 58 by dither 68 changes the effective optical thickness of element 58, and hence the overall optical path length of the external cavity of the apparatus 66.

Modulation of the external cavity optical path length via frequency dither introduced by element 68 produces detectable intensity variations in the output power of external cavity laser 66. An output beam 70 is emitted from facet 20 of gain medium 12. Output beam 70 is collimated by lens 72 along an output path 74 for use. Output beam 72 may be focused into an optical fiber (not shown) as described below. A beam splitter 76 is positioned in path 74 and picks off a portion of output beam 72 as a test beam 78, which is directed along path 80 to a photodetector 82. The modulation applied to optical path length control element 58, and hence to the external cavity optical path length, is detectable as a modulation in the voltage output of detector 82. Detector 82 is operatively coupled to a controller 84, which may comprise a conventional data processor, which generates error signals according to the voltage output of detector 82. Controller 84 also is operatively coupled to TEC 26, and provides control signals to TEC 26 to heat or cool platform 16, and hence the gain medium 12 and optical path length control element 58 thermally coupled to platform 16, to adjust external cavity optical path length according to the error signals derived from output of detector 82.

Controller 84 is operatively coupled to etalons 36, 38 of wavelength selection element 32 and provides wavelength selection control instructions thereto for thermo-optic tuning of the wavelength fed back to gain medium 12 by etalons 36, 38 as described above. Controller 84 may also be operatively coupled to dither element 68, so that controller 84 can adjust the frequency of modulation of refractive index introduced to optical path length control element 58.

The intensity variations in the voltage output signal of photodetector 82 resulting from the modulation introduced by dither 68 will decrease in magnitude and phase error as a laser external cavity mode is aligned with the center wavelength of the transmission or pass band defined by wavelength selection element 32. As the laser external cavity mode becomes misaligned with respect to the center of the selected wavelength, the magnitude and phase error of the modulation as detected in voltage output of detector 83 correspondingly increase.

Figure 7:
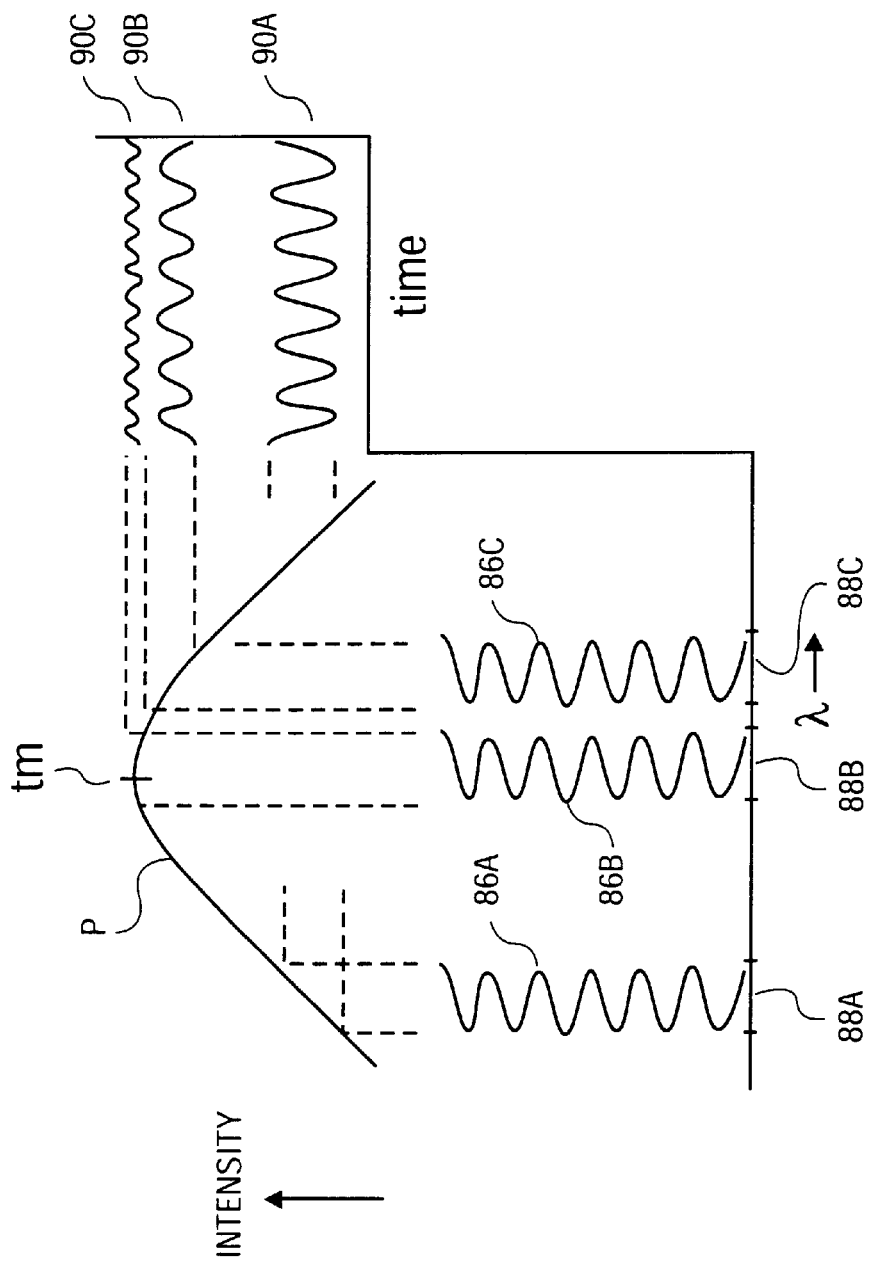
FIG. 7 is a graphical illustration of the error signals derived from frequency modulation of the external cavity in the apparatus of FIG. 6.

Referring also to FIG. 7, the relationship of the dither modulation signal introduced to an external cavity with respect to output from detector 82 is illustrated graphically as wavelength versus relative intensity. FIG. 7 shows a transmission peak P with a transmission maximum $t_m$ at a selected wavelength defined according to the configuration of etalons 36, 38. This selected wavelength may be tuned or adjusted by adjustment of etalons 36, 38 as described above. Frequency modulation or dither signals 86a, 86b, 86c corresponding to external cavity laser modes 88a, 88b, 88c are shown with respect to peak P. External cavity mode 88a is off center with respect to transmission maximum $t_m$ and at a shorter wavelength than the transmission maximum $t_m$, while external cavity mode 88c is offset or shifted with respect to transmission maximum $t_m$ at a longer wavelength. External cavity mode 88b has the same wavelength as the selected wavelength of transmission maximum $t_m$ and is aligned in wavelength or locked to the transmission maximum $t_m$. The relationship of external cavity mode 88b with transmission maximum $t_m$ represents an optimal loss profile for the external cavity, and results in maximum output power observable by photodetector 82. The relationships of modes 88a and 88c with transmission maximum $t_m$ are non-optimal and result in detectable loss in laser output power, with correction of the external cavity optical path length required to return to optimal alignment as shown for mode 88b. The external cavity mode 88a is shifted away from the transmission maximum $t_m$ by a greater amount than is external cavity mode 88c, and the offset of mode 88a from transmission maximum $t_m$ results in greater loss than occurs from the offset of mode 88c.

The voltage output from detector 82 resulting from dither modulation signals 86a–c are shown respectively as voltage modulation signals 90a, 90b and 90c on the right side of FIG. 7, which correspond respectively to the laser mode wavelengths 88a, 88b and 88c. The location of laser mode 88a at a wavelength shorter than that of the center wavelength than transmission maximum $t_m$ of peak P results in voltage signal 90a having a modulation that is in phase with the dither modulation signal 86a. The location of laser mode 88c at a greater wavelength than the transmission maximum $t_m$ results in a modulation of voltage signal 90c that is out of phase with respect to the modulation of dither signal 86c.

The location of each laser mode wavelength 88a–88c with respect to the spectral curvature of the transmission peak P affects the amplitude of the corresponding voltage signal. Thus, voltage signal 90a, which corresponds to laser mode 88a at a wavelength on a relatively steep slope of transmission peak P, has a relatively large modulation in amplitude, while voltage signal 90c, which corresponds to laser mode 88c that is positioned closer to transmission maximum $t_m$ and on a less steep slope, has a correspondingly smaller modulation in amplitude. Voltage signal 90b, which corresponds to centered laser mode 88b, has a minimal modulation amplitude since the period of the dither modulation signal 86b occurs symmetrically about the transmission maximum $t_m$ of peak P. The frequency of the dominant intensity in the case of voltage signal 90b in this instance is twice the frequency of dither modulation signal 86b.

From FIG. 7 it can be seen that the amplitude of the modulation detected by detector 82 indicates the magnitude of correction or adjustment required for the laser external cavity, while the phase of voltage signal modulation from detector 82 indicates the direction of the adjustment. The amplitude of dither modulation signals 86a–c is selected so that, during wavelength lock (as shown by mode 88b and transmission maximum $t_m$), the variation in the intensity of voltage signal modulation is held to acceptable levels for the particular use of the external cavity laser apparatus 66. The frequency of the dither modulation is chosen to be high enough to provide coherence control, but low enough to prevent interference with the use of the laser output, such as the modulation of data onto a carrier signal provided by the external cavity laser.

The detection or monitoring of laser output power may also be carried out by monitoring the voltage across gain medium 12 during laser operation. Detector 82 and beam splitter 76 may be omitted, allowing a higher level of usable output power. The use of voltage modulation across a gain medium to monitor laser output power is described in U.S. patent application Ser. No. 09/900,426, the disclosure of which is incorporated herein by reference.

Figure 8:
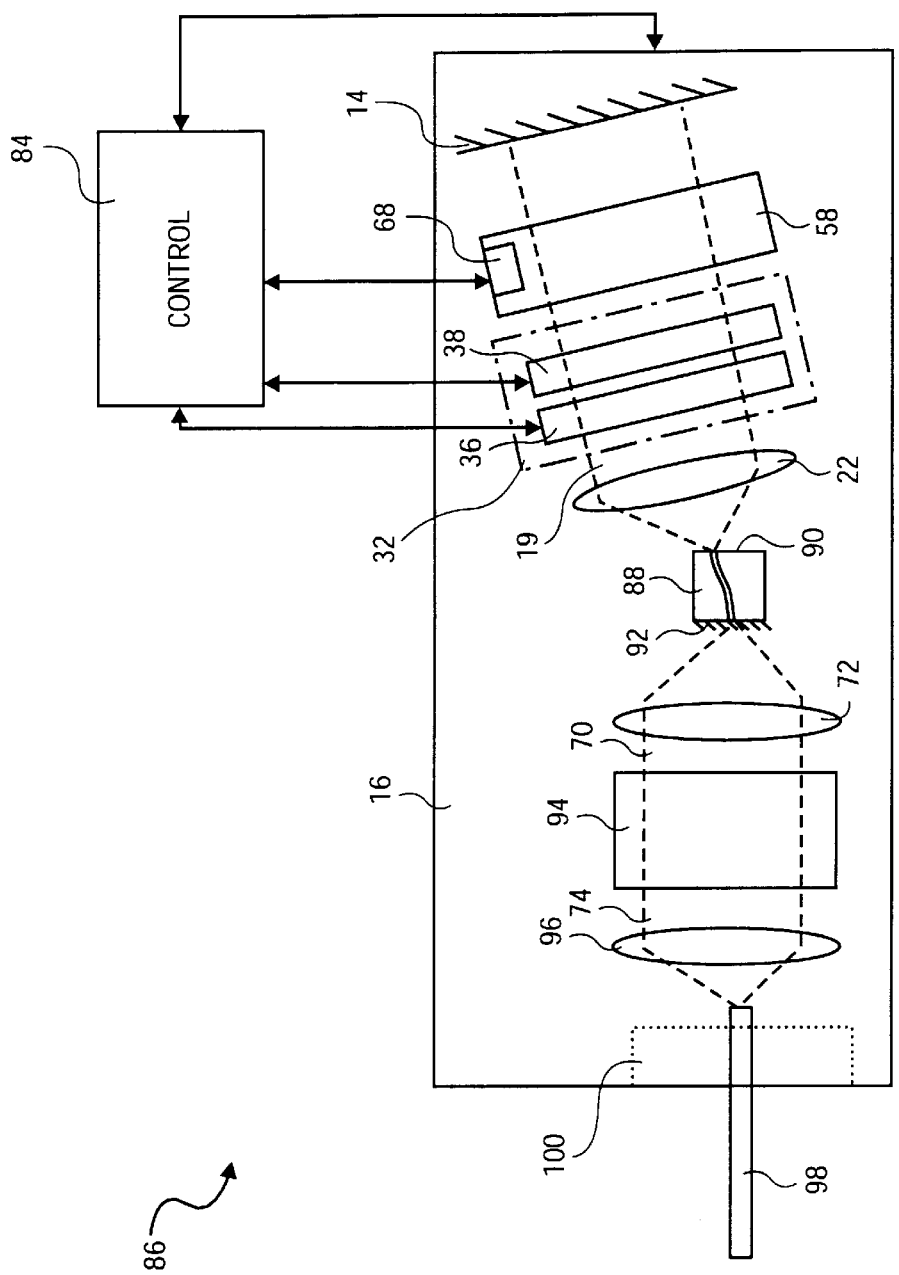
FIG. 8 is a schematic top plan view of another embodiment of a laser apparatus in accordance with the invention.

Referring now to FIG. 8, an external cavity laser apparatus 86 in accordance with the invention is shown, wherein like reference numbers are used to denote like parts. The laser apparatus 86 has a bent waveguide gain medium 88 with non-parallel facets 90, 92 that respectively emit beams 19, 70 along optical paths 24, 74 that are not co-linear. The use of a bent waveguide gain medium 88 prevents direct reflectances from the surfaces of etalons 36, 38 or other surfaces in the external cavity, from returning to gain medium 88. Such direct reflectances that have not undergone filtering through etalons 36, 38 detract from lasing at the selected wavelength.

The apparatus 86 provides selective thermal control of the external cavity optical path length via thermally controlled platform 16 as described above, and also provides thermal control of other laser components that are thermally coupled to platform 16. In the apparatus 86, output beam 70 is collimated along path 74 by lens 72 and directed through an optical isolator 94. Beam 70 is then focused by lens 96 into an optical fiber 98, which is supported by a ferrule 100. Lenses 22, 72, 96 and optical isolator 94, as well as gain medium 88, path length control element 58, end mirror 14 and other components (not shown) such as filters, polarization optics or the like, are thermally coupled to substrate 16 by a thermally conductive adhesive or solder, which may be CTE-matched to each particular component as described. Lenses 22, 72, 96 and optical isolator 94 may be structured and configured in a manner which promotes thermal contact with substrate 16. In this regard, Lenses 22, 72, 96 and optical isolator 94 may be housed in suitable thermally conductive housings (not shown) to promote thermal contact with substrate 16. Substrate 16 may likewise include grooves, recesses or other surface feature (not shown) configured to optimize thermal contact with the aforementioned components.

Collective thermal control of lenses 22, 72, 96, optical isolator 94, gain medium 88, path length control element 58, and end mirror 14 by thermally controlled platform 16 allows all important optical surfaces of the laser apparatus 86 to be maintained at a higher temperature than the surrounding environment. This reduces the likelihood of condensation of moisture or other volatiles onto important optical surfaces, as the condensation will be more likely to form on cooler surfaces of components that are not part of the apparatus 86 and are not subject to temperature control. Collective thermal control of the aforementioned laser components by a common thermally controlled platform 16 also reduces the risk of mis-alignment of components due to thermal mis-registration as different components are subject to different temperatures.

Thermally controlling the optical isolator 94 via platform 16 also allows for adjusting the wavelength at which the optical isolator 94 provides optimum suppression of feedback light. In some embodiments, the optical isolator 94 may be under separate thermal control and mounted on a separate thermally controlled platform (not shown). The optimization of feedback suppression by thermal control of an isolator is described in the U.S. patent application entitled "OPTICAL ISOLATOR APPARATUS AND METHODS" to inventor Mark McDonald, Attorney Docket No. NUFO 039, filed simultaneously herewith, and incorporated herein by reference.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A laser apparatus, comprising:

a thermally conductive platform;

a gain medium thermally coupled to said platform, said gain medium having a first output facet and a second output facet and pumped to emit a light beam from the first output facet in response to an electrical input;

reflector positioned in said light beam and coupled to said platform, said reflector and the second output facet defining an external laser cavity having an optical path length; and a temperature controller thermally coupled to the platform to provide thermal control of the gain medium via thermal conduction through the platform, said thermal control of the gain medium to adjust the optical path length of the external laser cavity by changing a refractive index of the gain medium.

2. The apparatus of claim 1, further comprising a thermal control element operatively coupled to said platform and configured to provide temperature control to said platform.

3. The apparatus of claim 1, further comprising an external cavity optical path length control element thermally coupled to said platform between the reflector and the first output facet, the external cavity optical path length control element to enable the optical path length of the external laser cavity to be adjusted via a change in its refractive index in response to being heated or cooled via the platform.

4. The apparatus of claim 3, wherein said external cavity optical path length control element comprises a dither element configured to introduce a modulation to said external cavity optical path length.

5. The apparatus of claim 1, further comprising an optical isolator coupled to said platform, said optical isolator positioned in an output path/beam of the second output facet of said gain medium.

6. A laser apparatus, comprising:
a thermally conductive platform;
a gain medium thermally coupled to said platform, said gain medium having first and second facets and to emit a first light beam from said first facet;
an end mirror positioned in said first light beam and coupled to said platform, said end mirror and said second facet defining an external laser cavity having an optical path length; and
a thermoelectric controller thermally coupled to said platform to cause the platform to expand and contract in response to a temperature change of the platform, thereby adjusting the optical path length of the external laser cavity.

7. The apparatus of claim 6, further comprising a wavelength selection element coupled to said platform, said wavelength selection element positioned in said first light beam before said end mirror.

8. The apparatus of claim 6, further comprising an optical isolator thermally coupled to said platform, said optical isolator positioned in a second beam emitted from said second facet of said gain medium.

9. The apparatus of claim 7, wherein said wavelength selection element comprises first and second thermally tunable etalons, said thermally tunable etalons coupled to said platform, said thermally tunable etalons thermally insulated from said platform.

10. The apparatus of claim 6, further comprising an optical path length control element positioned in said light beam before said end mirror, said optical path length control element thermally coupled to said platform.

11. The apparatus of claim 10, wherein said optical path length control element comprises a dither element positioned in said first light beam before said end mirror and configured to introduce a modulation to the external cavity optical path length.

12. The apparatus of claim 11, further comprising a servo element operatively coupled to said optical path length control element, said servo element configured to generate error signals according to said modulation of said external cavity optical path length, said servo element configured to adjust said thermal control element according to said error signals.

13. A method of laser operation, comprising:
providing an external cavity laser having a gain medium with first and second output facets and a reflector coupled to a thermally conductive platform, said reflector and said second output facet defining an external laser cavity having an optical path length; and
changing a said optical path length by thermally controlling said platform.

14. The method of claim 13, wherein changing said optical path length comprises thermally controlling the platform to expand or to contract the platform to change the optical path length.

15. The method of claim 13, wherein changing said optical path length comprises
thermally controlling a refractive index of said gain medium, wherein said gain medium is thermally coupled to the platform.

16. The method of claim 13, further comprising:
positioning an optical path length control element in an optical path between the first output facet and the reflector; and
thermally coupling said optical path length control element to said platform.

17. The method of claim 16, wherein changing said optical path length comprises thermally controlling a refractive index of said optical path length control element.

18. The method of claim 16, further comprising introducing a frequency modulation to said optical path length control element.

19. The method of claim 18, further comprising generating error signals from said frequency modulation introduced to said optical path length control element.

20. The method of claim 19, wherein changing said optical path length is carried out according to said error signals.

21. The method of claim 13, further comprising:
positioning a wavelength selection element in an optical path between the first output facet and the reflector;
coupling said wavelength selection element to said platform; and
feeding back light of selected wavelength to said gain medium.

22. A method of laser operation, comprising:
providing an external cavity laser having a gain medium with first and second output facets and an end mirror coupled to a thermally conductive platform, said end mirror and said second output facet defining an external laser cavity having an optical path length;
emitting a first light beam from said first output facet; and
adjusting said optical path length by thermally controlling said gain medium to change a refractive index of the gain medium through thermal control of the platform.

23. The method of claim 22, wherein said providing said temperature control to said platform comprises thermally coupling a thermal control element to said platform.

24. The method of claim 22, further comprising:
adjusting said optical path length via expansion and/or contraction of the platform induced in response to thermally controlling a temperature of the platform.

25. The method of claim 24, further comprising positioning an optical path length control element in an optical path between the first output facet and the end mirror and thermally coupling said external cavity optical path length control element to said platform.

26. The method of claim 25, further comprising adjusting said optical path length by thermally controlling a refractive index of said optical path length control element.

27. The method of claim 25, further comprising introducing a frequency modulation to said optical path length control element.

28. The method of claim 27, further comprising generating error signals from said frequency modulation introduced to said optical path length control element.

29. The method of claim 28, wherein adjusting said optical path length of said external laser cavity is carried out according to said error signals.

30. The method of claim 22, further comprising:
   positioning a wavelength selection element in an optical path between the first output facet and the end mirror;
   coupling said wavelength selection element to said platform; and
   feeding back light of a selected wavelength to said gain medium.

31. The method of claim 22, further comprising:
   emitting a second light beam from said second facet of said gain medium;
   positioning an optical isolator in said second light beam; and
   thermally coupling said optical isolator to said platform.

* * * * *

UNITED STATES PATENT AND TRADEMARK OFFICE
CERTIFICATE OF CORRECTION

PATENT NO. : 6,763,047 B2
DATED : July 13, 2004
INVENTOR(S) : Daiber et al.

It is certified that error appears in the above-identified patent and that said Letters Patent is hereby corrected as shown below:

Column 14,
Line 60, after "platform", insert -- wherein a thermally conductive carrier thermally coupled between said gain medium and said platform --.
Line 67, after "length;", delete "and".

Column 15,
Line 3, after "platform", insert -- and the thermally conductive carrier --.
Line 6, after "medium" insert -- ; and
a wavelength selection element coupled to said platform, said wavelength selection element positioned in said light beam between said first output facet and said reflector, said wavelength selection element thermally insulated from said platform --.
Line 27, after "platform", insert -- wherein a thermally conductive carrier thermally coupled between said gain medium and said platform --.
Line 33, delete "and".
Line 38, after "cavity", insert -- ; and
 A wavelength selection element coupled to said platform, said wavelength selection element positioned in said first light beam between said first facet and said end mirror, said wavelength selection element thermally insulated from said platform. --.
Lines 39-42, delete "further comprising a wavelength selection element coupled to said platform, said wavelength selection element positioned in said first light beam before said end mirror" and insert -- wherein said thermoelectric controller to provide thermal control of the gain medium via thermal conduction through the platform and the thermally conductive carrier, said thermal control of the gain medium to adjust the optical path length of the external laser cavity by changing a refractive index of the gain medium --.

Column 16,
Line 4, after "platform", insert -- wherein a thermally conductive carrier thermally coupled between said gain medium and said platform --.
Line 6, after "length", insert -- , wherein a wavelength selection element coupled to said platform, said wavelength selection element positioned between said first output facet and said reflector, said wavelength selection element thermally insulated from said platform --.
Line 16, delete ", wherein said gain medium is thermally coupled to the platform".
Line 35, after "comprising", delete ":
positioning a wavelength selection element in an optical path between the first output facet and the reflector;"

UNITED STATES PATENT AND TRADEMARK OFFICE
CERTIFICATE OF CORRECTION

PATENT NO. : 6,763,047 B2
DATED : July 13, 2004
INVENTOR(S) : Daiber et al.

It is certified that error appears in the above-identified patent and that said Letters Patent is hereby corrected as shown below:

Column 16 (cont'd),
Line 46, after "platform", insert -- wherein a thermally conductive carrier thermally coupled between said gain medium and said platform --.
Line 48, after "length", insert -- , wherein a wavelength selection element coupled to said platform, said wavelength selection element positioned between said first output facet and said end mirror, said wavelength selection element thermally insulated from said platform --.
Line 51, after "medium", insert -- via the thermally conductive carrier --.
Line 56, delete ":".

Column 17,
Line 10, delete ":"
positioning a wavelength selection element in an optical path between the first output facet and the end mirror;
coupling said wavelength selection element to said platform; and".

Signed and Sealed this

Twenty-first Day of September, 2004

JON W. DUDAS
*Director of the United States Patent and Trademark Office*